US008167083B2

(12) United States Patent
Litovsky et al.

(10) Patent No.: US 8,167,083 B2
(45) Date of Patent: May 1, 2012

(54) RECONFIGURABLE LOUDSPEAKER ENCLOSURE

(75) Inventors: Roman N. Litovsky, Newtown, MA (US); Chester Smith Williams, Lexington, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 12/782,152

(22) Filed: May 18, 2010

(65) Prior Publication Data

US 2011/0284315 A1 Nov. 24, 2011

(51) Int. Cl.
*H05K 5/00* (2006.01)

(52) U.S. Cl. ........ 181/156; 181/144; 181/145; 181/146; 181/147; 181/148

(58) Field of Classification Search .................. 181/144, 181/145, 146, 147, 148, 156
See application file for complete search history.

(56) References Cited

U.S. PATENT DOCUMENTS

| | | | | | |
|---|---|---|---|---|---|
| 2,789,158 | A | * | 4/1957 | Livingston | 348/836 |
| 4,139,734 | A | * | 2/1979 | Fincham | 381/335 |
| 4,142,603 | A | * | 3/1979 | Johnson | 181/148 |
| 4,441,577 | A | * | 4/1984 | Kurihara | 181/147 |
| 4,932,060 | A | * | 6/1990 | Schreiber | 381/300 |
| 5,291,559 | A | * | 3/1994 | Freadman | 381/386 |
| 5,821,471 | A | * | 10/1998 | McCuller | 181/156 |
| 5,892,182 | A | * | 4/1999 | Newman | 181/156 |
| 6,079,515 | A | * | 6/2000 | Newman | 181/156 |
| 6,973,994 | B2 | * | 12/2005 | Mackin et al. | 181/156 |
| D518,029 | S | | 3/2006 | Tsang | |
| 7,454,025 | B2 | * | 11/2008 | Saiki | 381/161 |
| 7,503,422 | B2 | * | 3/2009 | Combest et al. | 181/150 |
| 7,624,840 | B2 | * | 12/2009 | Konno et al. | 181/199 |

OTHER PUBLICATIONS

Music Studio 1 Picture of a speaker in the possession of the Undersigned. Will be submitted to the examiner on the examiner's request. The speaker was known to exist as of the date of filing of the application, but the date of its creation is not known.
Music Studio 2 Picture of the same speaker as Music Studio 1, which in the possession of the Undersigned. Will be submitted to the examiner on the examiner's request. The speaker was known to exist as of the date of filing of the application, but the date of its creation is not known.
Digital photograph 1 of speaker in possession of the applicant. To the best of applicant's knowledge, this speaker is a physical implementation of the Tsang patent D518029.
Digital photograph 2 of speaker in possession of the applicant. To the best of applicant's knowledge, this speaker is a physical implementation of the Tsang patent D518029.
Digital photograph 3 of speaker in possession of the applicant. To the best of applicant's knowledge, this speaker is a physical implementation of the Tsang patent D518029.
Digital photograph 4 of speaker in possession of the applicant. To the best of applicant's knowledge, this speaker is a physical implementation of the Tsang patent D518029.

* cited by examiner

*Primary Examiner* — Forrest M Phillips
(74) *Attorney, Agent, or Firm* — Bose Corporation

(57) ABSTRACT

A reconfigurable loudspeaker enclosure. A loudspeaker enclosure, includes a first section that includes a mounting location for an acoustic driver. The mounting location includes a first section mating surface and first section walls, a second section that includes an exit for an acoustic element from which acoustic energy can be radiated. The second section includes a second section mating surface and second section walls. The first section mating surface and the second section are rotatably coupled so that in a first configuration the first section walls and the second section walls are substantially continuous, and so that in a second configuration, the walls of the two sections are substantially non-continuous or perpendicular or both and so that in both the first configuration and the second configuration the two sections are coupled acoustically.

15 Claims, 8 Drawing Sheets

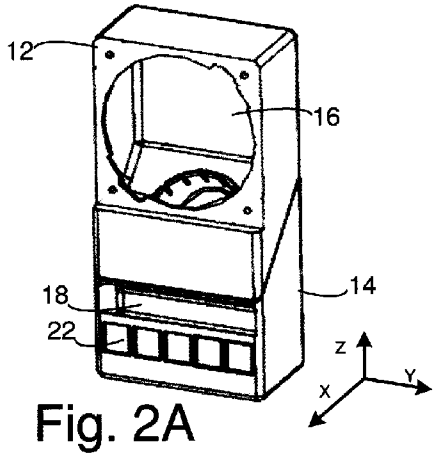
Fig. 2A
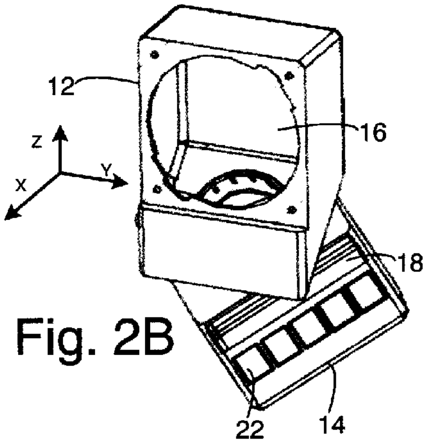
Fig. 2B
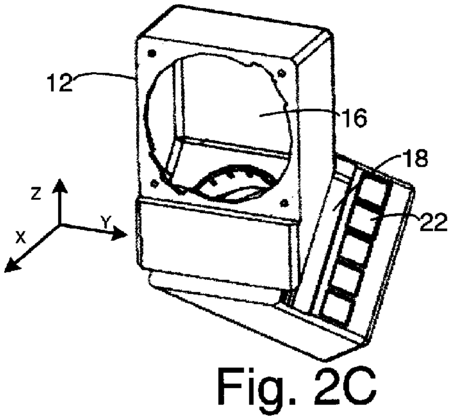
Fig. 2C
Fig. 2D
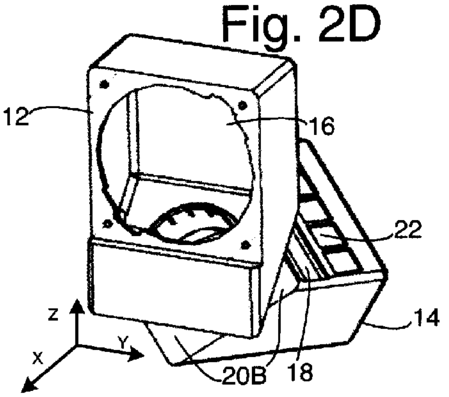
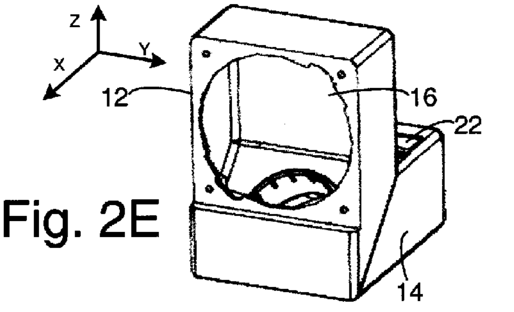
Fig. 2E

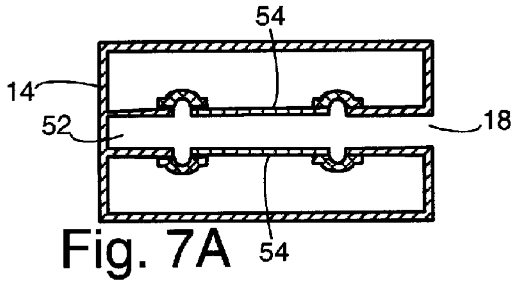
Fig. 7A
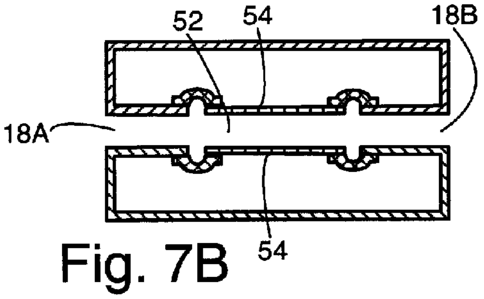
Fig. 7B
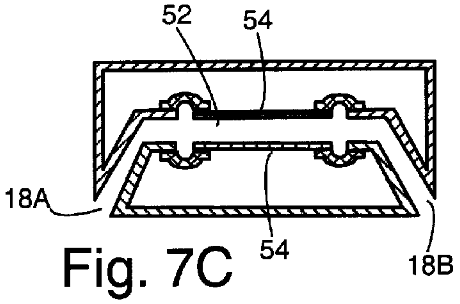
Fig. 7C
Fig. 8A
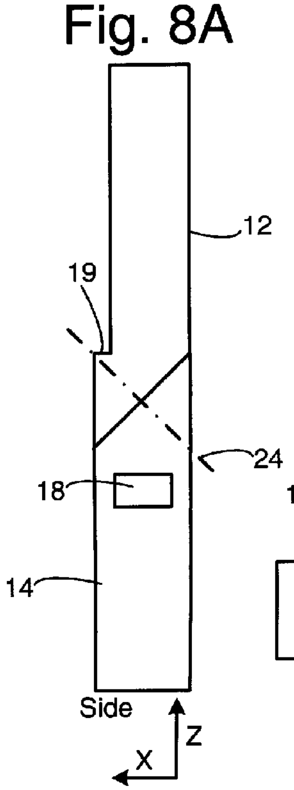
Fig. 8B
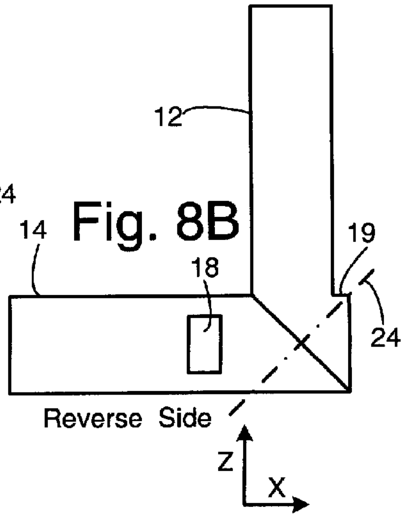

RECONFIGURABLE LOUDSPEAKER ENCLOSURE

BACKGROUND

This specification describes a reconfigurable loudspeaker enclosure.

SUMMARY

In one aspect a loudspeaker enclosure includes a first section that includes a mounting location for an acoustic driver. The mounting location includes a first section mating surface and first section walls, a second section that includes an exit for an acoustic element from which acoustic energy can be radiated. The second section includes a second section mating surface and second section walls. The first section mating surface and the second section are rotatably coupled so that in a first configuration the first section walls and the second section walls are substantially continuous, and so that in a second configuration, the walls of the two sections are substantially non-continuous or perpendicular or both and so that in both the first configuration and the second configuration the two sections are coupled acoustically. The loudspeaker enclosure may be a port. The acoustic element may be a waveguide. The loudspeaker enclosure may include a baffle structure to form the waveguide. The loudspeaker enclosure of claim 1, wherein the acoustic element may include a passive radiator. The acoustic element may be a second acoustic driver. At least a portion of the first section mating surface and at least a portion of the second section mating surface may be non-planar. The first section and the second section may be coupled by a rotatable, airtight joint. The airtight joint may include an O-ring. The second section may include a groove for the O-ring and the first section includes a lip for engaging the groove and compressing the O-ring. The second section may include deflectable beams to hold the lip against the O-ring. The exit may be in a second section wall and the mounting location may be in a first section wall and the exit wall may be perpendicular to the mounting location wall. The first section mating surface may be oblique to a first section wall, and the second section mating surface may be oblique to a second section.

Other features, objects, and advantages will become apparent from the following detailed description, when read in connection with the following drawing, in which:

BRIEF DESCRIPTION OF THE SEVERAL VIEWS OF THE DRAWING

FIGS. 2A-2E are isometric views of a reconfigurable loudspeaker enclosure in different orientations;

FIGS. 7A-7C are diagrammatic cross-sectional views of a loudspeaker with reconfigurable enclosure with various implementations of passive radiators;

FIGS. 8A and 8B are diagrammatic plan views of a reconfigurable loudspeaker;

DETAILED DESCRIPTION

Figure 1A:
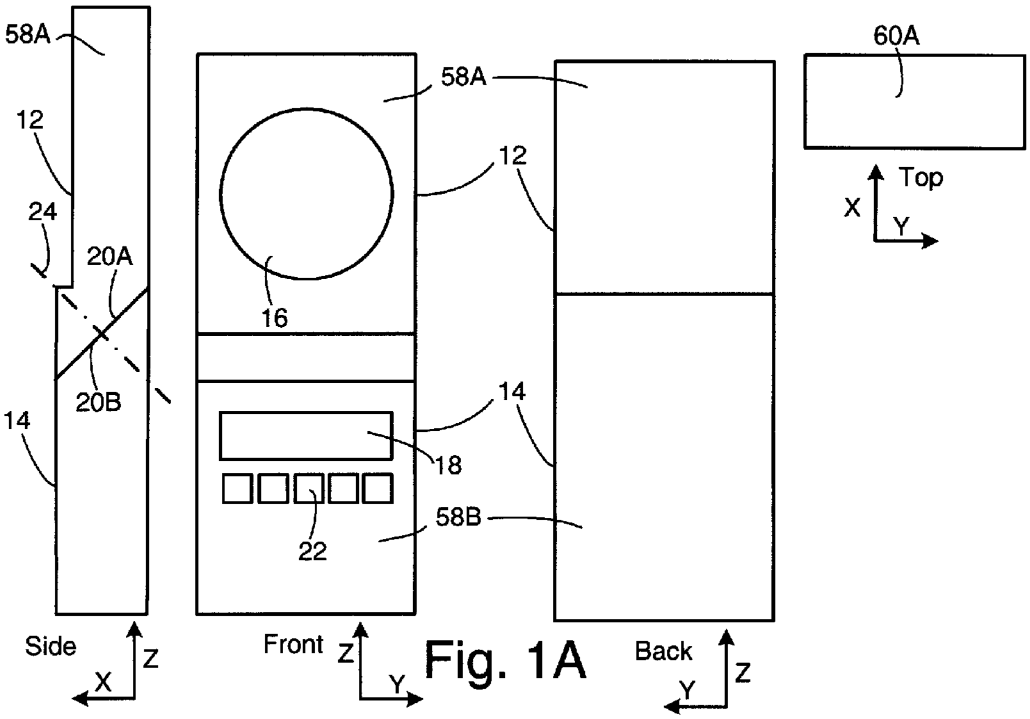
FIGS. 1A-1D are diagrammatic plan views of a loudspeaker enclosure.

FIG. 1A shows plan views of a reconfigurable loudspeaker enclosure in a first configuration. Loudspeaker enclosure includes a first section 12 and a second section 14. The first section 12 includes a mounting hole 16 for an acoustic driver. The second section 14 may include a radiation opening 18 from which acoustic energy can be radiated. The opening 18 can be, for example, a waveguide exit, a port, or an acoustically transparent exit for radiation from passive radiators, as will be described below. The second section 14 may also include acoustically resistive openings 22, which are for acoustic purposes not germane to this specification but are shown in some figures to better illustrate the orientation of the components of the sections in the different configurations. The sections 12 and 14 each have walls 58A and 58B, respectively, that may be planar or may intersect, or both, as in FIG. 1A, or may be a continuous non-planar surface. The sections 12 and 14 interface along surfaces 20A and 20B that are oblique to the fronts and backs of the sections. Sections 12 and 14 also have ends 60A and 60B, respectively, opposite the mating surface. Sections 12 and 14 are mechanically coupled so that they can rotate relative to each other about axis 24, which is perpendicular to interface surfaces 20A and 20B. Sections 12 and 14 are also acoustically coupled. The ends 60A and 60B may be substantially parallel. In the configuration of FIG. 1A, the non-mating wall surfaces 58A of section 12 and the non-mating wall surfaces 58B of section 14 are substantially continuous The mechanical coupling of sections 12 and 14 also provides acoustic coupling and is airtight. First section 12 may have a shelf 19 so that when an acoustic driver is mounted and a protective or cosmetic grille is placed in front of the acoustic driver, the front surface is substantially planar. In the configuration of FIG. 1A, a loudspeaker with the enclosure can be used, for example, mounted on or in a wall.

Figure 1B:
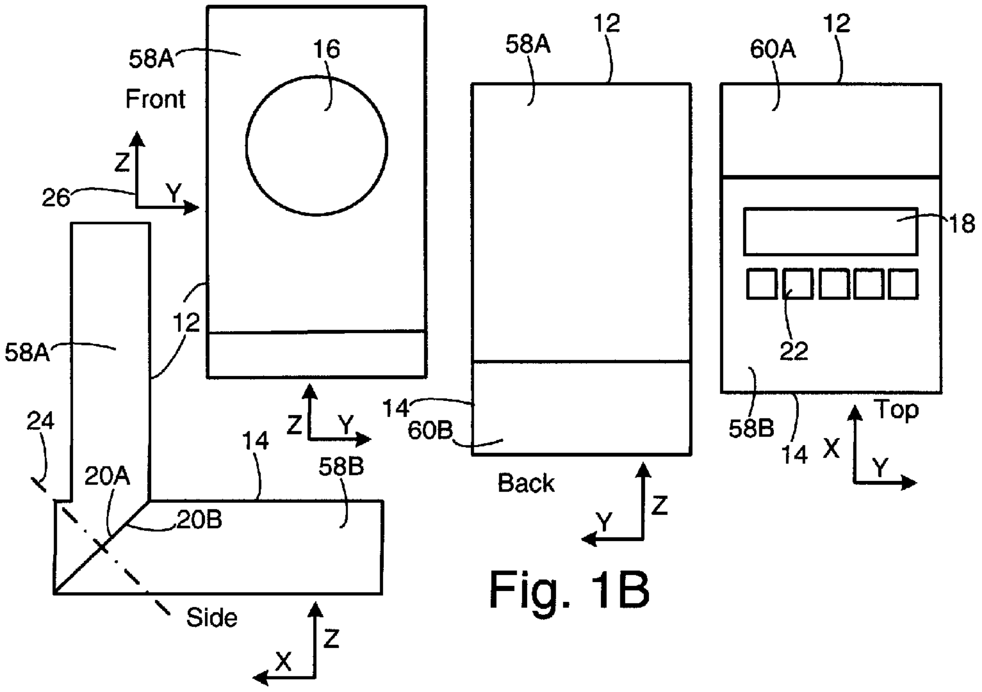

FIG. 1B shows the loudspeaker in a second configuration, in which section 14 has been rotated relative to section 12 by 180 degrees about axis 24, which is perpendicular to mating surfaces 20A and 20B. In the configuration of FIG. 1B, the walls 58A of section 12 and the walls 58B of section 14 are substantially perpendicular or non-continuous or both, so that in the two sections form an "L" or reverse "L" when viewed from the side. Ends 60A and 60B of the two sections may be perpendicular. The acoustic characteristics, for example the volume of the enclosure, the tuning of any waveguides, ports, or passive radiators and the like are the same in both the configurations of FIGS. 1A and 1B. In the configuration of FIG. 1B, a loudspeaker with the enclosure has less front surface visible than a loudspeaker with the configuration of FIG. 1A and has more bottom surface so it is more stable when placed on or against a horizontal surface. A loudspeaker with the enclosure of FIG. 1B could be used on a desktop, mounted on a flat panel monitor or television, or on a shelf or on a wall bracket.

Figure 1C:
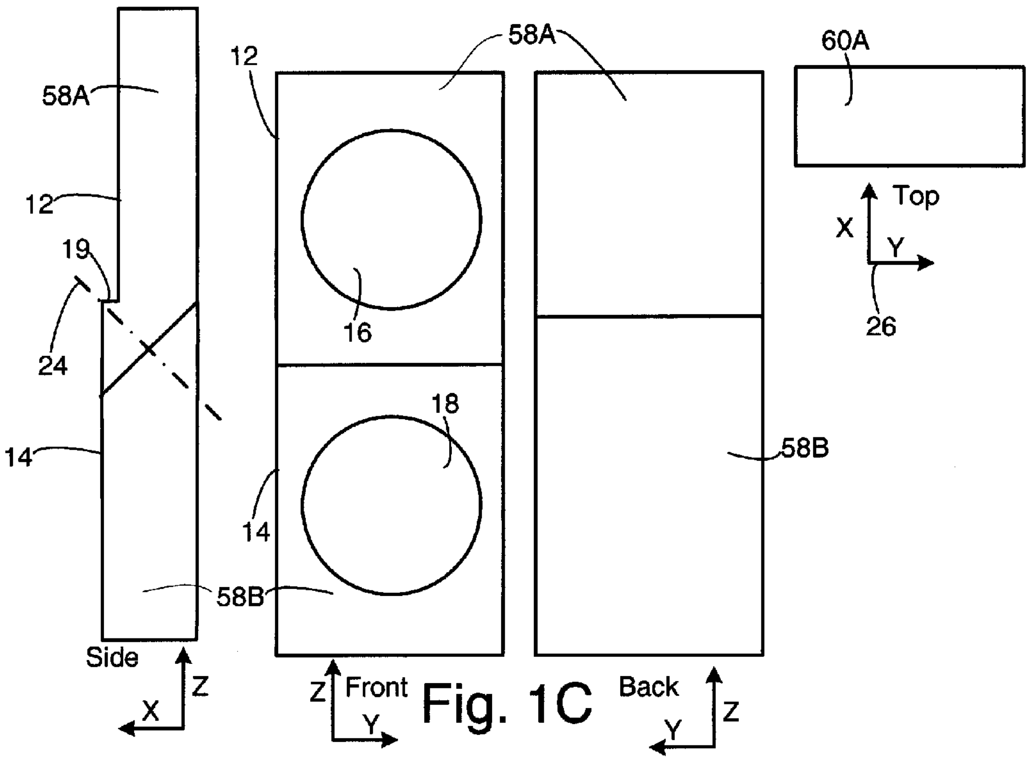
Figure 1D:
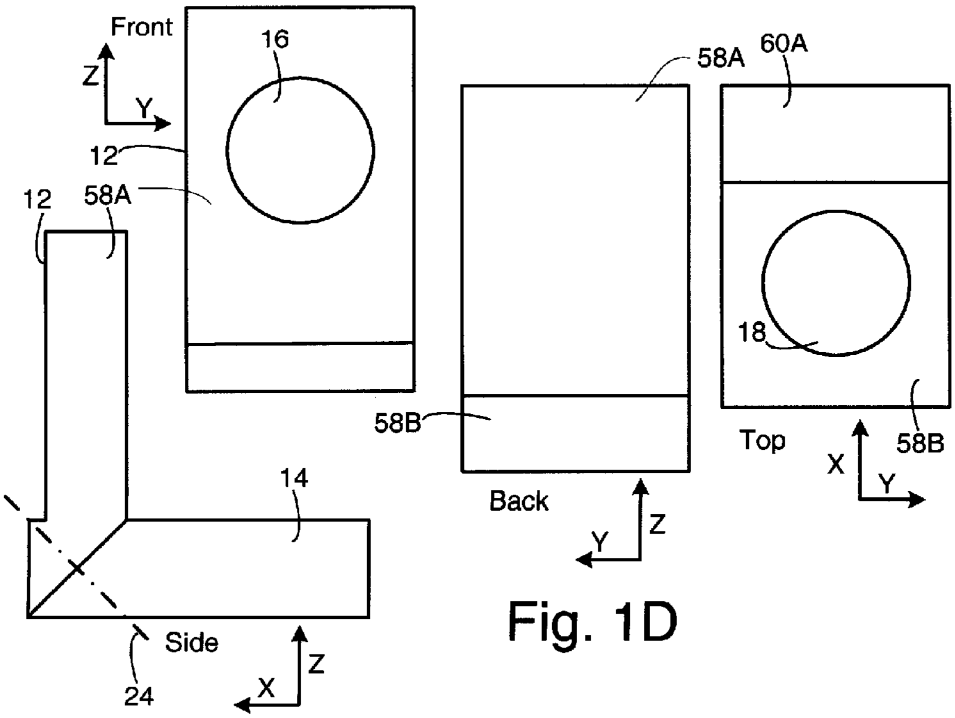

In the implementation of FIGS. 1C and 1D, the radiation opening 18 is a mounting hole for a second acoustic driver. The second acoustic driver may be acoustically isolated from the first acoustic driver, for example by providing backs on the two acoustic drivers or baffles separating the interior of sections 12 and 14, or sections 12 and 14 may be acoustically in the same manner as the loudspeaker enclosures of FIGS. 1A and 1B. Furthermore, the enclosure may have additional radiation openings such as ports, waveguide exits, or openings for radiation from passive radiators. Other elements of FIGS. 1C and 1D refer to like numbered element in FIGS. 1A and 1B.

FIGS. 2A-2E are isometric views illustrating the reconfiguration of the loudspeaker. In FIG. 2A, the loudspeaker is in the configuration of FIG. 1A. FIGS. 2B-2D, show the lower section rotated 45 degrees, 90 degrees, and 135 degrees, respectively. FIG. 2E shows the lower section rotated 180 degrees so that it is in the configuration of FIG. 1B.

Figure 3A:
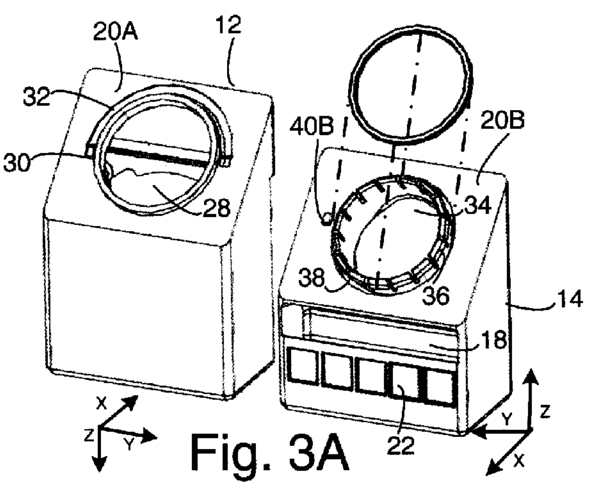
FIG. 3A is an isometric view two portions of a reconfigurable loudspeaker enclosure with one part shown in partial blowup.

FIG. 3A shows acoustic enclosure disassembled, with the first section 12 shown upside down. First section 12 has a circular opening 28 in first section mating surface 20A. Defining the circular opening 28 is circumferential lip 30. First section 12 also has a semi-circular groove 32 in the surface surrounding the lip 30. Second section 14 has an opening 34 in mating surface 20B surrounded by a number of beveled deflectable beams such as beam 36 extending substantially perpendicularly relative to the mating surface 20B. The beveled deflectable beams 36 are surrounded by a circular groove 38. Outside the groove 38 is a nubbin 40 protruding from the mating surface 20B of second section 14.

Figure 3B:
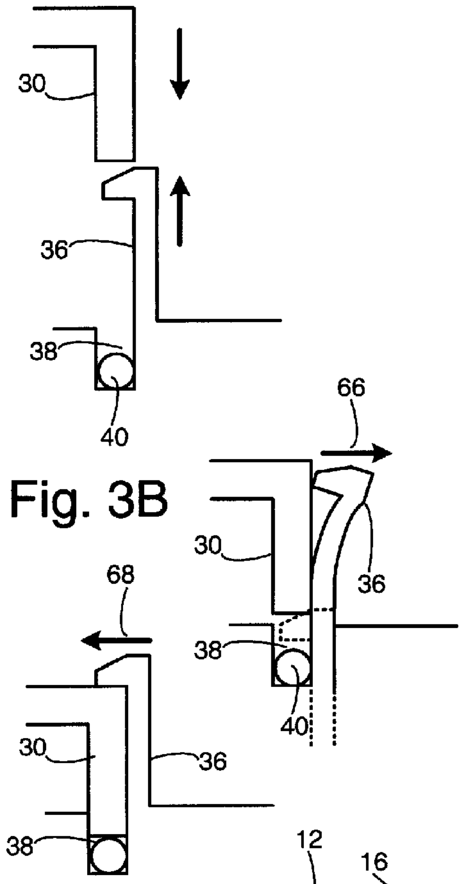
FIG. 3B is a diagrammatic view of a portion of one of the sections of FIG. 3A.

To assemble the loudspeaker enclosure, an O-ring 42 is inserted in second section groove 38. Mating surfaces 20A and 20B are then pushed together. The beams 36 have beveled protrusions 62 as shown in FIG. 3B so that pushing the mating surfaces together in the direction shown by arrow 64 causes the beams 36 to deflect away from the lip in the direction indicated by arrow 66. When protrusion 62 clears the first section 12, the beam snaps back into place in the direction indicated by arrow 68, thereby holding the two sections together while allowing the two sections to rotate relative to each other. Pushing the mating surfaces together also causes first section lip 30 to enter first section groove 38 and compress O-ring 42, thereby forming a substantially airtight seal between the interiors of sections 12 and 14. The first section lip 30 is held in compression against the O-ring 42 by deflectable beam 36. Nubbin 40 engages second section semicircular groove 32 to prevent rotation of more than 180 degrees. The diagram of FIG. 3B is for demonstrating the operation of the airtight joint only. The elements of FIG. 3B are not drawn to scale.

Figure 4A:
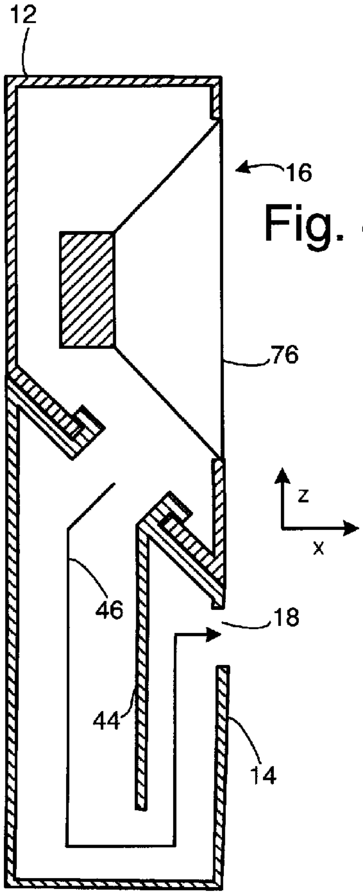
FIGS. 4A and 4B are diagrammatic cross-sectional views of a loudspeaker with a reconfigurable enclosure with a waveguide.
Figure 4B:
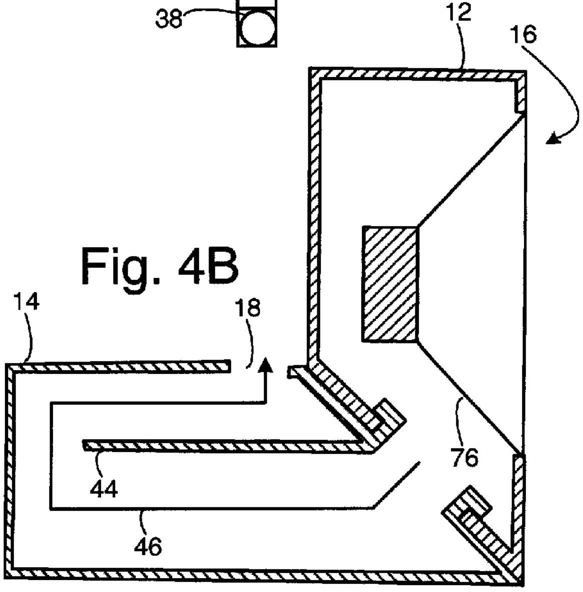

FIGS. 4A and 4B show cross sections of various embodiments of the loudspeaker with an acoustic driver 76 in mounting hole 16. The cross sections are taken in the X-Z plane. The embodiment of FIG. 4A includes a baffle structure 44 defining a waveguide with a physical length indicated by arrow 46. In one implementation the baffle structure is arranged so that the waveguide is tuned to approximately 400 Hz. In the embodiment of FIG. 4B, the second section 14 has been rotated 180 degrees relative to the first section 12 to obtain the configuration of FIG. 1B. FIGS. 4A and 4B illustrate that in the configuration of FIG. 4A, the radiation opening 18, in this case a waveguide exit, and the mounting hole are both on the front surface, while in the configuration of FIG. 4B, the radiation opening faces upward and is in back of the first section 12.

Figures 5A, 5B, 6A, 6B:
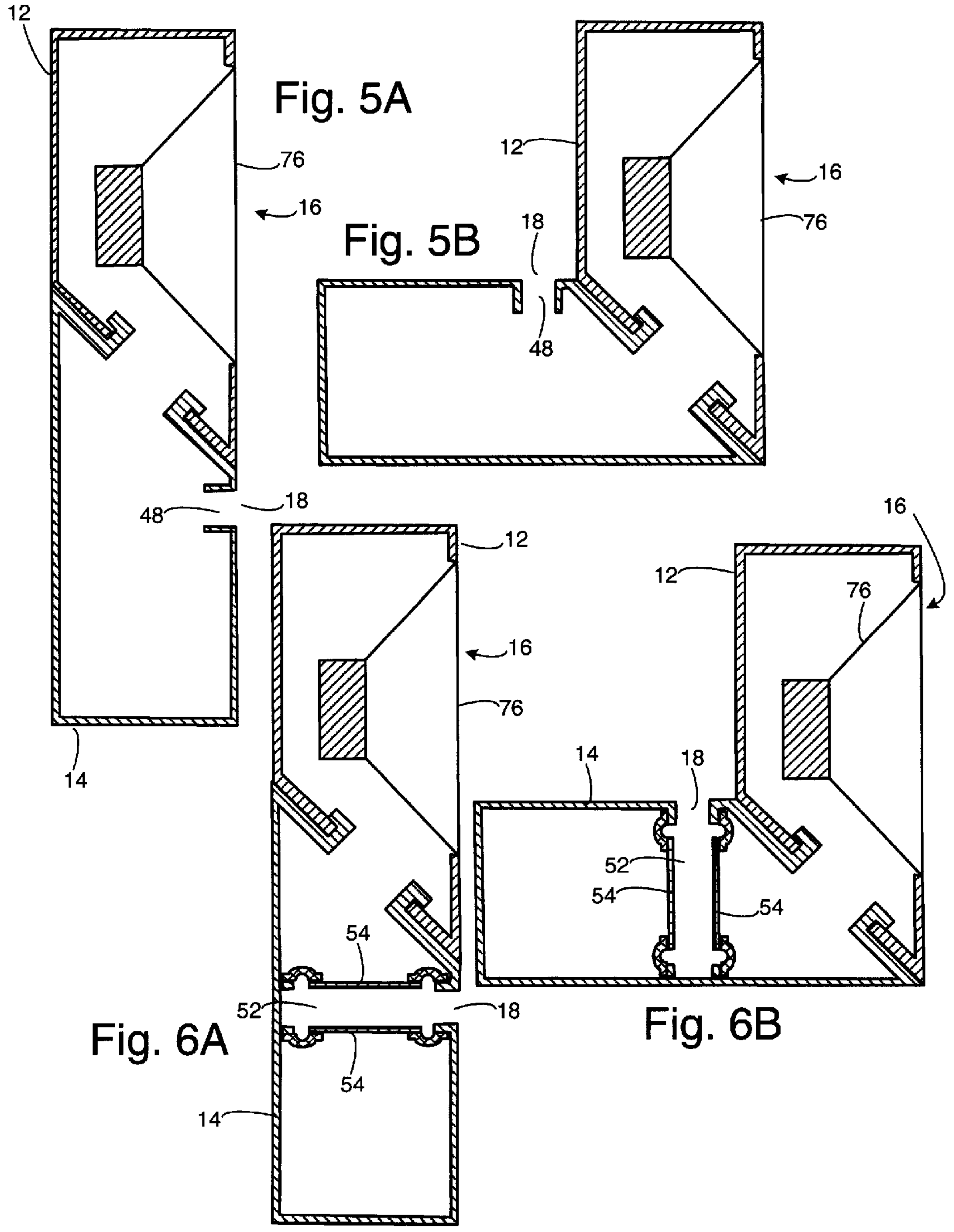
FIGS. 5A and 5B are diagrammatic cross-sectional views of a loudspeaker with a reconfigurable enclosure with a port.
FIGS. 6A and 6B are diagrammatic cross-sectional views of a loudspeaker with a reconfigurable enclosure with passive radiators.

In the embodiment of FIGS. 5A and 5B, the radiation opening 18 is the exit of a port 48.

In the embodiment of FIGS. 6A and 6B, the radiation opening 18 is an opening to a cavity 52, into which passive radiators 54 radiate acoustic energy in a manner described in U.S. patent application Ser. No. 10/629,996, incorporated herein by reference.

FIGS. 7A, 7B, and 7C show cross sections in the X-Y plane of variations of the configuration of FIGS. 6A and 6B. In FIG. 7A, the radiation opening 18 is on a side of the enclosure, that is, on a wall that is perpendicular to the wall in which the mounting hole 26 is. In FIG. 7B, there are two radiation openings 18A and 18B on either side of the enclosure. In FIG. 7C, there are two radiation openings in a chamfered arrangement. As shown in FIGS. 8A and 8B, with one radiation opening on the side as in FIG. 7A, in the configuration of FIG. 1A, the opening is on one side of the enclosure and in the configuration of FIG. 1B, the opening is on the reverse side.

Figure 9A:
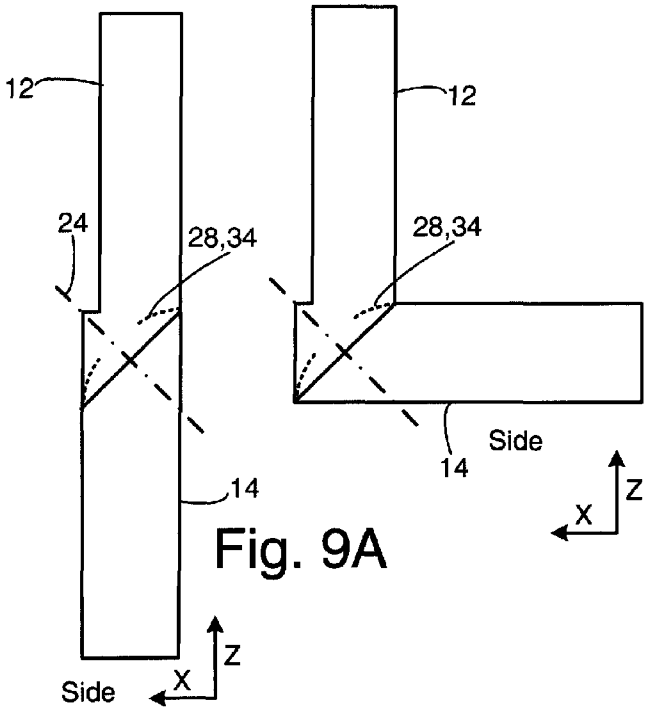
FIG. 9A is a diagrammatic plan view of a reconfigurable loudspeaker enclosure illustrating the interface between the two sections of the enclosure.
Figure 9B:
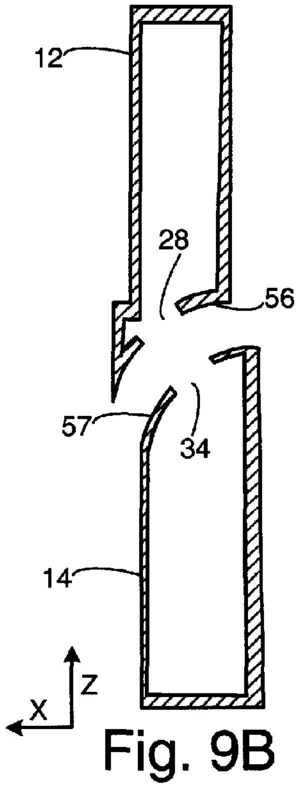
FIG. 9B is a diagrammatic cross-sectional view of a reconfigurable loudspeaker enclosure illustrating the interface between the two sections of the enclosure.
Figure 9C:
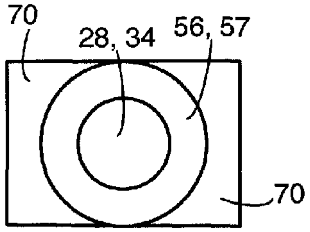
FIG. 9C is a diagrammatic view of an interface of the mating surfaces of the two sections of a reconfigurable loudspeaker.

The interface surfaces 20A and 20B may be completely or partially non-planar, so long as the non-planar surfaces have cylindrical symmetry. For example, interface surface of the first section 12 of the loudspeaker of FIG. 9A has a concave portion 56 and the second section 14 has a matching convex portion 58, so that the cross section taken in the X-Z plane is as shown in FIG. 9B. For clarity some elements, such as the elements of the swivel joint are not shown in this view. The opening 28 provides acoustic coupling of the two sections. FIG. 9C shows the mating surfaces 20A and 20B viewed along the axis 24. The non-concave, non-convex portions 70 of the mating surfaces 20A and 20B are planar.

Figure 10:
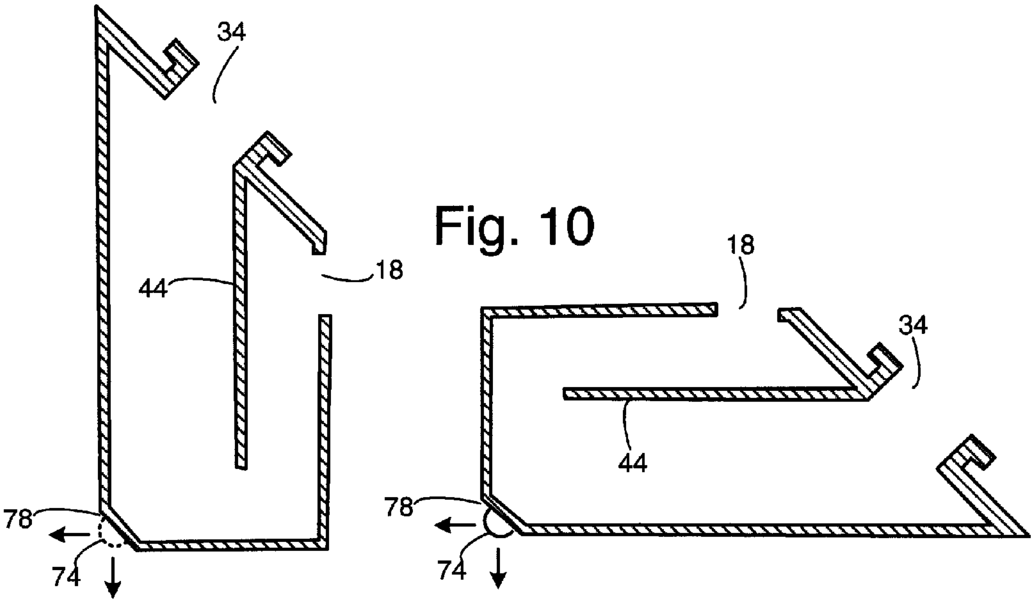
FIG. 10 is a diagrammatic cross-sectional view of one portion of one implementation of a reconfigurable loudspeaker enclosure showing the location of a connection terminal or jack.

FIG. 10 shows a cross section of second section 14 with a position of a connection terminal or jack 78 specified. The connection terminal may be positioned in a chamfered portion of corner 74, which is at the intersection of the bottom and the back in the configuration of both FIGS. 1A and 1B. The connection terminal may be rotatable as shown in dotted line, facing in either of the directions indicated by arrows 76.

Figure 11:
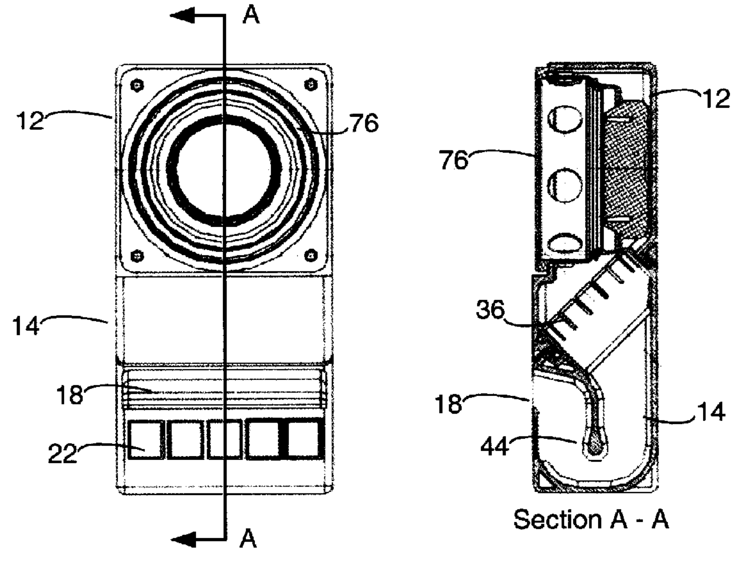
FIG. 11 is a cross-sectional view of a loudspeaker having a reconfigurable enclosure.

FIG. 11 shows an actual implementation of the loudspeaker enclosure of the previous figures, with an acoustic driver 72 installed. Reference numbers correspond to like numbered elements in the previous figures.

Numerous uses of and departures from the specific apparatus and techniques disclosed herein may be made without departing from the inventive concepts. Consequently, the invention is to be construed as embracing each and every novel feature and novel combination of features disclosed herein and limited only by the spirit and scope of the appended claims.

What is claimed is:

1. A loudspeaker enclosure, comprising:

a first section comprising a mounting location for an acoustic driver, comprising a first section mating surface and first section walls;

a second section comprising an exit for an acoustic element from which acoustic energy can be radiated, comprising a second section mating surface and second section walls;

wherein the first section mating surface and the second section are mechanically coupled so that in a first configuration the first section walls and the second section walls are substantially continuous, and so that from the first configuration the first section and the second section are rotatable about an axis that is oblique to the first section walls and the second section walls to result in a second configuration in which the walls of the two sections are substantially non-continuous or perpendicular or both and so that in both the first configuration and the second configuration the two sections are coupled acoustically.

2. The loudspeaker enclosure of claim 1, wherein the acoustic element is a port for radiating acoustic energy from an acoustic driver in the mounting location in the first section.

3. The loudspeaker enclosure of claim 1, wherein the acoustic element is a waveguide for radiating acoustic energy from an acoustic driver in the mounting location in the first section.

4. The loudspeaker enclosure of claim 3, further comprising a baffle structure to form the waveguide.

5. The loudspeaker enclosure of claim 1, wherein the acoustic element comprises a passive radiator for radiating acoustic energy from an acoustic driver in the mounting location in the first section.

6. The loudspeaker enclosure of claim 1, wherein the acoustic element is a second acoustic driver.

7. The loudspeaker enclosure of claim 1, wherein at least a portion of the first section mating surface and at least a portion of the second section mating surface are non-planar.

8. The loudspeaker enclosure of claim 1, wherein the first section and the second section are coupled by a rotatable, airtight joint.

9. The loudspeaker enclosure of claim 8, wherein the airtight joint comprises an O-ring.

10. The loudspeaker enclosure of claim 9, the second section comprising a groove for the O-ring, the first section comprising a lip for engaging the groove and compressing the O-ring.

11. The loudspeaker enclosure of claim 10, the second section comprising deflectable beams to hold the lip against the O-ring.

12. The loudspeaker enclosure of claim 1, wherein the exit is in a second section wall and the mounting location is in a first section wall and wherein the exit wall is perpendicular to the mounting location wall.

13. The loudspeaker enclosure of claim 1, wherein the first section mating surface is oblique to a first section wall, and wherein the second section mating surface is oblique to a second section wall.

14. The loudspeaker enclosure of claim 1, wherein an acoustic driver in the mounting location in the first section and the exit in the second section are acoustically coupled.

15. The loudspeaker enclosure of claim 1, wherein the first section mating surface and the second section are mechanically coupled so that from the first configuration the first section and the second section are rotatable by 180 degrees about an axis that is oblique to the first section walls and the second section walls to result in the second configuration.

* * * * *